United States Patent [19]
Natzle et al.

[11] Patent Number: 5,792,275
[45] Date of Patent: Aug. 11, 1998

[54] FILM REMOVAL BY CHEMICAL TRANSFORMATION AND AEROSOL CLEAN

[75] Inventors: Wesley Charles Natzle, New Paltz; Jin Jwang Wu, Ossining; Chienfan Yu, Highland Mills, all of N.Y.

[73] Assignee: International Business Machines Corporation, Armonk, N.Y.

[21] Appl. No.: 467,658

[22] Filed: Jun. 6, 1995

[51] Int. Cl.$^6$ .............................. B08B 5/00; H01L 21/00
[52] U.S. Cl. ................................ 134/7; 438/906
[58] Field of Search .................... 134/7; 156/640.1, 156/662.1, 628.1; 216/57, 58, 62, 92, 52; 438/690, 705, 906

[56] References Cited

U.S. PATENT DOCUMENTS

| | | | |
|---|---|---|---|
| 5,030,319 | 7/1991 | Nishino et al. | 156/635 |
| 5,041,229 | 8/1991 | Brock et al. | 252/79.1 |
| 5,062,898 | 11/1991 | McDermott et al. | 134/7 |
| 5,209,028 | 5/1993 | McDermott et al. | 51/426 |
| 5,282,925 | 2/1994 | Jeng et al. | 156/646 |
| 5,294,261 | 3/1994 | McDermott et al. | 134/7 |
| 5,372,652 | 12/1994 | Srikrishnan et al. | 134/7 |
| 5,378,312 | 1/1995 | Gifford | 156/643 |
| 5,472,369 | 12/1995 | Foster et al. | 134/7 X |

OTHER PUBLICATIONS

"Chemical downstream etching of silicon–nitride and polycrystalline silicon using $CF_4/O_2/N_2$: Surface chemical effects of $O_2$ and $N_2$ additives" by J.J. Beulens, et al., Appl. Phys. Lett. 66(20), 15 May 1995, pp. 2634–2636.

"Tech Trends" by Michael B. Olesen, Jul./Aug. 1992 Microcontamination pp. 60–64.

"Investigating Techniques to Improve Gate–Oxide Integrity" by Marc Meuris, et al., Microcontamination May 1992, pp. 31–69.

"Wafer Cleaning: Wet Methods Still Lead the Pack" by Ron Iscoff, 58/Semiconductor International Jul. 1983.

"What's Driving Resist Dry Stripping" by Pieter Burggraaf, Nov. 1994, Semiconductor International/61.

Primary Examiner—Thi Dang
Attorney, Agent, or Firm—Alison D. Mortinger

[57] ABSTRACT

A film layer not susceptible to aerosol cleaning is removed from a surface by converting the film layer into a film susceptible to aerosol cleaning, and aerosol jet cleaning the converted film and any contaminants. The aerosol jet can be moved in relation to the surface to provide thorough cleaning.

9 Claims, 3 Drawing Sheets

FILM REMOVAL BY CHEMICAL TRANSFORMATION AND AEROSOL CLEAN

FIELD OF THE INVENTION

This invention is directed to the removal of layers of material on a surface, and more particularly to an apparatus and method for converting a film impervious to aerosol cleaning into a film susceptible to aerosol cleaning, which is then removed by an aerosol clean process.

BACKGROUND OF THE INVENTION

In the semiconductor industry, removal of films from substrates is a very important process. To that end, U.S. Pat. No. 5,282,925 issued Feb. 1, 1984 to Jeng, et al assigned to the present assignee and incorporated by reference herein in its entirety, describes a method for accurate etching and removal of thin films from a substrate. Jeng's method involves first putting a substrate with the thin film in a vacuum chamber. A reactant containing gas is then admitted into the chamber at a sufficient pressure to form a film containing reactant on top of the film to be removed. An accurate amount of the original film is converted to a converted film by controlling the nature and duration of the reactant-containing film, and the unwanted reactant and converted film are removed.

The removal is accomplished by either thermal desorption (evaporation) in a heated chamber or rinsing in a solvent. However, these removal methods have a serious disadvantage in that they leave behind contaminants, as illustrated in FIGS. 1a, 1b, and 1c. In FIG. 1a, an oxide film 12 and contaminants 14 are desired to be removed from wafer 10. In FIG. 1b, a reactant film 16 is formed on the oxide layer, and part or all of the oxide layer is converted into a reacted layer (not shown). After rinsing or desorption, the contaminants 14 are still present on the remaining portion of the oxide layer, or if all of the oxide has been removed, on the wafer 10 as shown in FIG. 1c.

Contaminants can generally be atoms, molecules, or particles. A common contaminant is metal atoms or particles from reactive ion etching (RIE) which can sputter off the RIE chamber walls and end up on the substrate. Another is organics (carbon-containing materials) that remain from earlier process steps such as portions of photoresist left behind or substances left from removing photoresist. Yet another is particles that are suspended in the air of the chamber and land on the substrate. Others are material left over from ion implantation, and material left after immersion in a liquid etch bath or after a liquid etch bath is evaporated from the substrate.

With Jeng's method, many contaminants will not be removed at all by desorption; rinsing is only partially effective at best; and rinsing can make matters worse as the substrate dries and remaining contaminants adhere more strongly to its surface, or contaminants in the rinse itself are imparted to the surface. U.S. Pat. No. 5,030,319 to Nishino et al describes additional methods for film conversion including chemical downstream etching (or chemical dry etching). Although the residue left by Nishino is removable by rinsing or desorption, Nishino's method suffers from the same problems as Jeng. Other methods for removing contaminants generally use multiple step aggressive chemical processes, with each step specifically tailored to a certain contaminant in order for the layer to be rinsable. See for example: Burggraaf, "What's Driving Dry Resist Stripping?" Semiconductor International, Nov. 1994. pp. 61–64; Other examples are: Iscoff, "Wafer Cleaning: Wet Methods Still Lead the Pack, Semiconductor International July 1993, pp 58–63; Meuris, et al "Investigating Techniques to Improve Gate-Oxide Integrity," Microcontamination. May 1992 pp. 31–37, 66–69;

Aerosol cleaning to remove particles and/or films from a surface is described for example in U.S. Pat. No. 5,294,261 to McDermott, et al assigned to the present assignee and incorporated by reference herein in its entirety. McDermott discloses the use of an argon or nitrogen aerosol to clean particles from a surface such as a silicon wafer, or to clean thick films such as bearing grease from glass surfaces. However, McDermott's aerosol is not a controlled removal, cannot clean a hard film, does not address the need to remove contaminants in such a film, and does not recognize the need to clean both hard films and particle contaminants.

Similar ways to clean particles using aerosols are described in U.S. Pat. Nos. 5,062,898 and 5,209,028 both to McDermott, et al., but suffer from the same disadvantages.

An aerosol has also been used to clean films from semiconductor sidewalls in U.S. Pat. No. 5,378,312 to Gifford, et al and assigned to the present assignee. Gifford discloses the use of a cryogenic aerosol to fracture and sweep away the films. Gifford's method, like the others, cannot be used for controlled removal of films and does not address the removal of contaminants. Furthermore, it cannot be used to remove films which are not able to be removed by the fracture mechanism.

Aerosol jet etching has attempted to combine removal of a film by etching and aerosol cleaning in one step in U.S. Pat. No. 5,041,229 to Brock, et al. Brock discloses a vapor stream of etchant combined with a cold gas stream to etch fine geometry patterns. By combining an etchant and an aerosol, uniformity of film removal is dependent upon the uniformity of the aerosol, which can only be achieved in small areas. Therefore Brock's method is not suitable for use in uniform, controlled film removal over large areas.

Thus, there remains a need to remove films that are impervious to aerosol cleaning, and during film removal to remove contaminants as well, without the use of multiple chemistries tailored to specific contaminants.

SUMMARY OF THE INVENTION

It is therefore an object of the present invention to provide a means for removing films impervious to aerosol cleaning and at the same time remove contaminants as well.

It is a further object to convert the original film into a film which can be removed by an aerosol.

It is another object to provide a means for converting and aerosol cleaning a film in one integrated apparatus.

In accordance with the above listed and other objects, a film layer is removed from a surface by converting the film layer into an aerosol-susceptible layer, and aerosol jet cleaning the aerosol-susceptible layer and any contaminants. The aerosol jet can be moved in relation to the surface to provide thorough cleaning.

BRIEF DESCRIPTION OF THE DRAWINGS

These and other features, aspects, and advantages will be more readily apparent and better understood from the following detailed description of the invention, in which:

FIG. 3a shows a cross section of the aerosol cleaning module from FIG. 3, all in accordance with the present invention.

DESCRIPTION OF THE PREFERRED EMBODIMENT

The present invention is described herein in the context of removal of a film from a semiconductor substrate merely as a specific example, and is not meant to limit applicability of the invention to semiconductor technology. Those skilled in the art will understand that the invention is broadly applicable to any film removal process in which it is desirable to remove a film which is not susceptible to aerosol cleaning from a surface, by converting the original film into a film susceptible to aerosol cleaning, and removing the converted film as well as any contaminants on the surface by using an aerosol.

U.S. Pat. No. 5,282,925 to Jeng et al., assigned to the present assignee, and incorporated herein in its entirety describes in detail a film removal apparatus for use in a vacuum environment for removal of a film layer from a surface such as a substrate. The apparatus includes a means for providing a reactive vapor in the vacuum environment, with the reactive vapor originating from either gaseous or solid source materials. A controlled reaction takes place with the film layer to convert the whole or a portion of the film layer into an aerosol-susceptible layer. An alternate method for converting the film layer to an aerosol-susceptible layer is described in U.S. Pat. No. 5,030,319 to Nishino et al which is incorporated herein in its entirety. One of Nishino's embodiments uses a plasma source for producing a reactant for the conversion process. Another alternate method for converting a layer is described in Beulens, et al "Chemical Downstream Etching of Silicon-Nitride and Polycrystalline Silicon Using $CF_4/O_2/N_2$: Surface Chemical Effects of $O_2$ and $N_2$ Additives" Appl. Phys. Lett. 66(20), May 15, 1995 pp. 2634–2636, which is incorporated by reference in its entirety. Generally, common reactants can be (although not exclusively) oxygen, $CF_4$ or other fluorocarbons, ammonia, HF, fluorine, chlorine, bromine, or other halogens, or mixtures thereof.

Figure 1A:
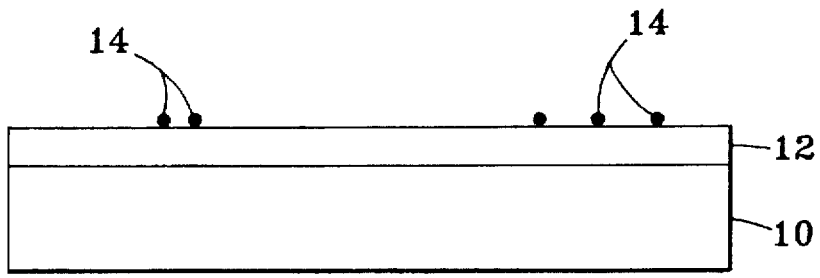
FIGS. 1a, 1b, and 1c are cross-sectional views of a prior art method of film removal which leaves contaminants on the wafer.
Figure 1B:
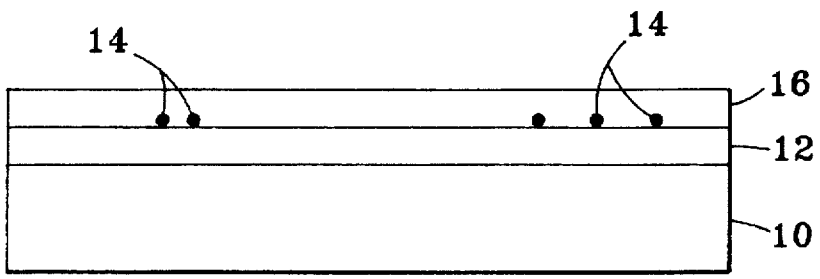
Figure 1C:
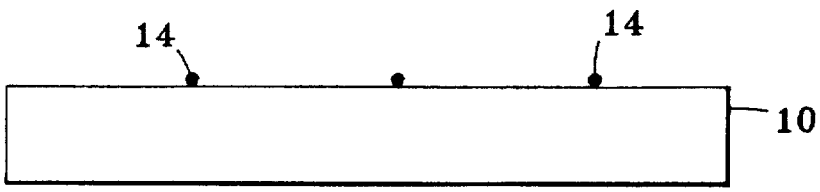
Figure 2A:
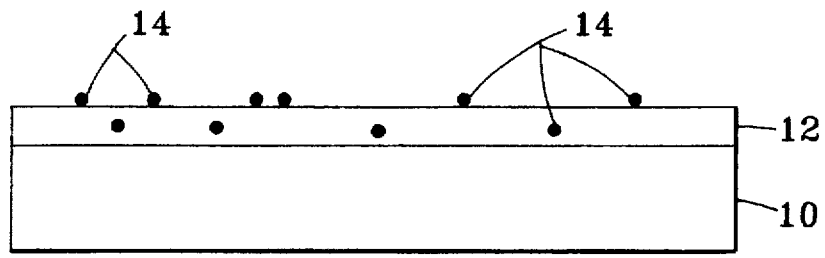
FIGS. 2a, 2b, and 2c are cross-sectional views of a film being removed by chemical transformation and aerosol cleaning.
Figure 2B:
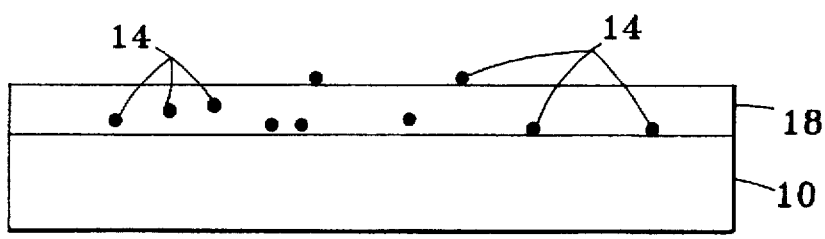
Figure 2C:
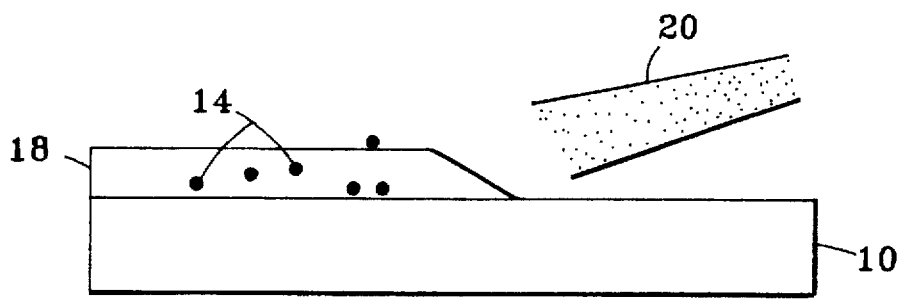

Referring now to the drawings and more particularly to FIGS. 2a, 2b, and 2c, there is shown a method for removal of a film by chemical transformation and aerosol clean. In FIG. 2a, substrate 10 in a vacuum chamber (not shown) has an oxide film 12 and contaminants 14 which are desired to be removed. Note that contaminants 14 can be present on the surface of or within film 12. Note also that film 12 is not susceptible to aerosol cleaning in its present state. In FIG. 2b, a reactant layer (not shown) was formed on the wafer and controlled etching occurred, for example by the method of U.S. Pat. No. 5,282,925 to Jeng et al. The result is a softened reacted (or converted) film 18, which is susceptible to aerosol cleaning. Note that alternate conversion processes (other than Jeng's) could remove some of film 12. Note also that contaminants 14 are still present on the wafer 10, as well as in and on the film 18, and that additional contaminants may result from the etching process. In FIG. 2c, an aerosol stream 20, formed by conventional means is used to remove the now aerosol-susceptible layer 18 as well as any contaminants 14 from the wafer 10, all in one step. It is important to note that contaminants 14 do not need to be converted using specific chemistries. The only chemistry required is that to produce layer 18, and any contaminants remaining within or on film 18 are removed in "clumps" by the aerosol cleaning process. A one-step cleaning of layer 18 and contaminants 14 results in an additional benefit of reduced thermal cycling of the chamber because desorption is no longer necessary. Thus process times are shortened.

A conventional aerosol apparatus is described in detail in U.S. Pat. No. 5,294,261 to McDermott, et al assigned to the present assignee, and incorporated by reference herein in its entirety. The aerosol apparatus includes a source of highly pure liquid-gas mixture, such as argon or nitrogen, and means to produce a cryogenic jet stream from the liquid-gas mixture. Note here that other materials may be used, such as carbon dioxide. Generally the material should be chemically inert to the wafer surface.

Figure 3:
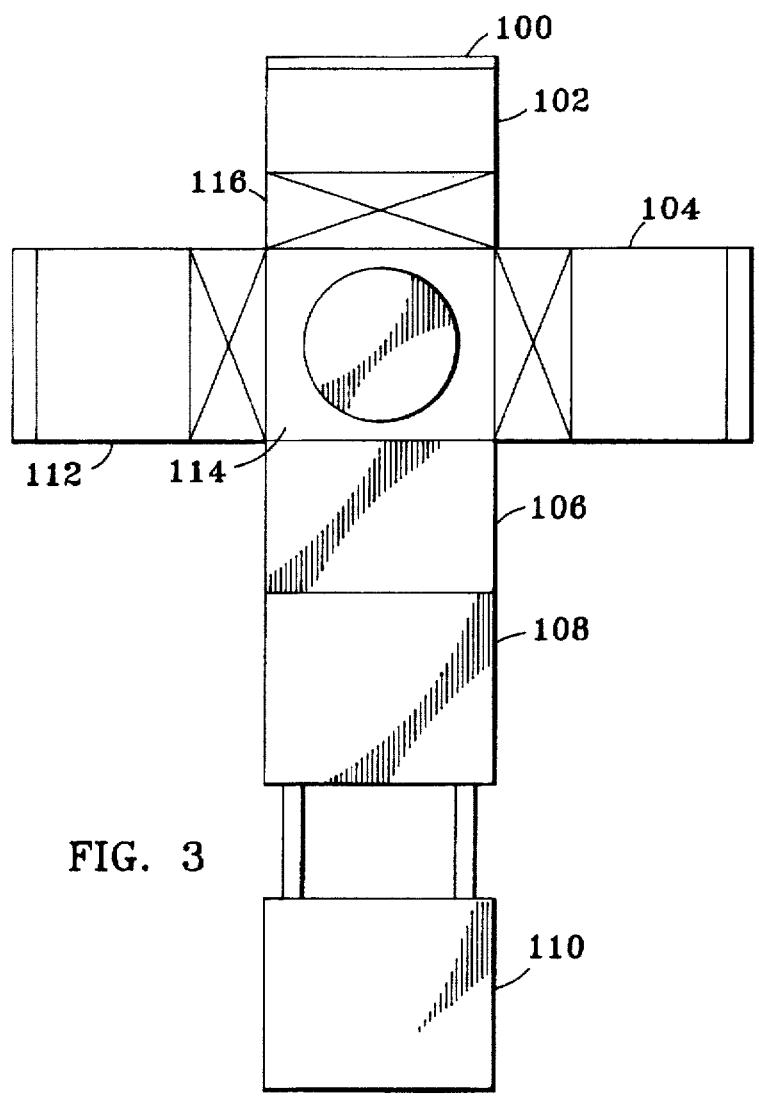
FIG. 3 shows a top down view of an integrated vapor reactor and aerosol cleaning system.
Figure 4:
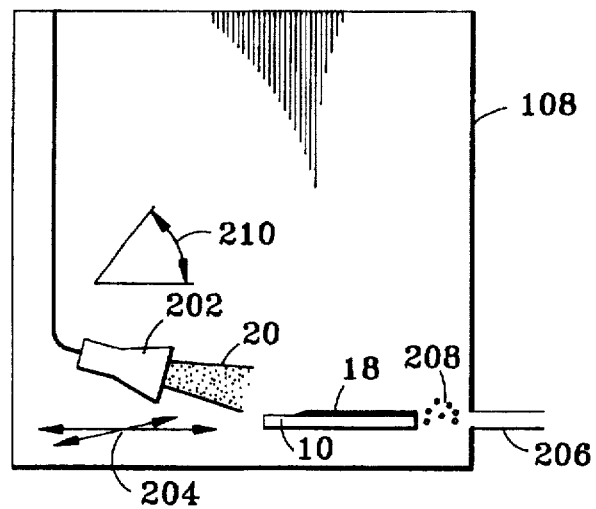

The film conversion and aerosol clean can be performed with separate apparatus, or the two steps can advantageously be combined in one apparatus so that the film removal can be performed more efficiently and under better process control conditions. Referring now to the drawings and more particularly to FIG. 3, a top down view of an integrated vapor reactor and aerosol cleaner for wafer batches is shown. A wafer cassette (not shown) is loaded through external port 100 into load module 102. Either the whole cassette or an individual wafer from the cassette is moved to central wafer handler module 114 through integration port 116. From the wafer handler module, the cassette/wafer moves to vapor reactor module 104, where film conversion takes place. The cassette/wafer then is moved back through handler module 114 and through isolation module 106 to aerosol clean module 108. Refrigerant module 110 provides the cooling to module 108. Note that other modules such as illustrated by module 112 can be easily integrated into the system.

A cross section of aerosol module 108 is shown in FIG. 3a. Aerosol stream 20 is directed at wafer 10 by nozzle 202. Reacted film layer 18 and any contaminants are removed from wafer 10 as reacted film 18 breaks into pieces 208. During operation of the module, the chamber is operated at a fraction of an atmosphere and a Roots blower (not shown) is employed to remove excess aerosol gas and film pieces 208 through port 206. Improved cleaning is achieved by moving aerosol stream 20 in relation to wafer 10. Note that the aerosol or wafer, or both can be moved relative to the other. Depending on the configuration of the aerosol, which can be a multi-jet arrangement, the movement can be in any direction in an x-y plane parallel to the plane of the substrate as indicated by arrows 204. In addition, the angle of the aerosol or wafer or both can be adjusted as indicated by arrows 210 to produce an optimal cleaning process so that all of the film and contaminants are removed.

Note that the use of this type of process is not limited to the preferred embodiment. A multi-step film conversion process may be desirable, such as with a topmost layer of a silicon substrate so that contaminants or damaged silicon can be removed prior to formation of gate oxides. In order to remove the silicon, the silicon is first oxidized (for example in an oxidation module) and then the process proceeds as described in the preferred embodiment.

Elements other than silicon are oxidized for example by exposure to air, ozone, oxygen atoms, or heating in the presence of oxygen. These oxides can be resistant to aerosol removal, but after exposure to HF or ammonia and HF, would produce a softened film which could be removed by aerosol treatment. Furthermore, the apparatus and method are not limited to semiconductor substrates. Organic layers and polymers are films that can be used in semiconductor processing as resists, heat or water sensitive organic polymers can be used for example in the medical field. These polymers can be cleaned by treating the top surface with ozone or oxygen atoms, which leaves behind an oxidized ash that can be removed with an aerosol. Another example is the cleaning of metals. Copper could be treated with chlorine to form copper chloride, which would be removed by aerosol. Other metals would react with halogens to produce aerosol removable layers. Yet another example is for fluxless soldering. Because oxide layers inhibit the formation of solder bonds, treatment with HF followed by an aerosol clean would enable certain metals to be soldered without the use of solder flux.

In summary, chemical transformation followed by aerosol cleaning enables the removal of an unwanted component, leaving a desired component. Chemical transformation changes the composition or structure of the unwanted component. The transformed component is then able to be removed by aerosol means, and any contaminants present on the desired component are removed in the aerosol step.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for removing a film which is not susceptible to aerosol cleaning from a semiconductor structure comprising:

converting the film to a converted film susceptible to aerosol cleaning;

removing the converted film and any contaminants on the semiconductor structure with an aerosol jet.

2. The method of claim 1 wherein the film is silicon dioxide.

3. The method of claim 1 wherein the film is silicon.

4. The method of claim 1 wherein the film is an organic layer.

5. A method for removing a film which is not susceptible to aerosol cleaning from a surface, comprising:

converting the film to a converted film susceptible to aerosol cleaning including providing a supply of reactant and allowing the reactant to react with the surface to form the converted film, wherein the reactant is formed from oxygen, a fluorocarbon, ammonia, HF, a halogen, or mixtures thereof; and removing the converted film and any contaminants on the surface with an aerosol jet.

6. The method of claim 5 wherein the aerosol jet is formed from a liquid-gas mixture, the liquid-gas mixture being chemically inert with respect to the surface.

7. The method of claim 6 wherein the aerosol jet is formed from nitrogen, carbon dioxide, argon, or mixtures thereof.

8. A method for removing a film which is not susceptible to aerosol cleaning from a surface, comprising:

converting the film to a converted film susceptible to aerosol cleaning including providing a supply of reactant and allowing the reactant to react with the surface to form the converted film, wherein the reactant comprises HF; and removing the converted film and any contaminants on the surface with an aerosol jet.

9. The method of claim 8 wherein the reactant further comprises $NH_3$.

* * * * *